United States Patent
Kiyosawa et al.

(10) Patent No.: US 9,018,699 B2
(45) Date of Patent: Apr. 28, 2015

(54) SILICON CARBIDE SEMICONDUCTOR ELEMENT AND METHOD FOR FABRICATING THE SAME

(75) Inventors: Tsutomu Kiyosawa, Hyogo (JP);
Kazuyuki Sawada, Hyogo (JP);
Kunimasa Takahashi, Osaka (JP); Yuki Tomita, Hyogo (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 117 days.

(21) Appl. No.: 13/814,433

(22) PCT Filed: Sep. 12, 2012

(86) PCT No.: PCT/JP2012/005777
§ 371 (c)(1),
(2), (4) Date: Feb. 5, 2013

(87) PCT Pub. No.: WO2013/042333
PCT Pub. Date: Mar. 28, 2013

(65) Prior Publication Data
US 2013/0168701 A1 Jul. 4, 2013

(30) Foreign Application Priority Data
Sep. 22, 2011 (JP) ................................ 2011-207887

(51) Int. Cl.
*H01L 29/66* (2006.01)
*H01L 21/02* (2006.01)
(Continued)

(52) U.S. Cl.
CPC ...... *H01L 21/02378* (2013.01); *H01L 29/1608* (2013.01); *H01L 29/8128* (2013.01);
(Continued)

(58) Field of Classification Search
CPC .............. H01L 21/02378; H01L 29/1608; H01L 29/7827; H01L 29/4236; H01L 29/42364; H01L 29/42368; H01L 29/66666; H01L 29/66712; H01L 29/66734; H01L 29/7813
USPC ............ 257/77, 329, 330, E29.257; 438/270, 438/268
See application file for complete search history.

(56) References Cited

U.S. PATENT DOCUMENTS 5,248,385 A * 9/1993 Powell .......................... 438/507
5,783,491 A 7/1998 Nakamura et al.
(Continued)

FOREIGN PATENT DOCUMENTS

JP 07-263692 A 10/1995
JP 10-154810 A 6/1998
(Continued)

OTHER PUBLICATIONS

International Search Report for corresponding International Application No. PCT/JP2012/005777 mailed Oct. 23, 2012.
(Continued)

*Primary Examiner* — Kenneth Parker
*Assistant Examiner* — John Lin
(74) *Attorney, Agent, or Firm* — Renner, Otto, Boisselle & Sklar, LLP

(57) ABSTRACT

A SiC semiconductor element includes: a SiC substrate which has a principal surface tilted with respect to a (0001) Si plane; a SiC layer arranged on the principal surface of the substrate; a trench arranged in the SiC layer and having a bottom, a sidewall, and an upper corner region located between the sidewall and the upper surface of the SiC layer; a gate insulating film arranged on at least a part of the sidewall and on at least a part of the upper corner region of the trench and on at least a part of the upper surface of the SiC layer; and a gate electrode arranged on the gate insulating film. The upper corner region has a different surface from the upper surface of the SiC layer and from a surface that defines the sidewall. The gate electrode contacts with both of a first portion of the gate insulating film located on the upper corner region and a second portion of the gate insulating film located on the sidewall. The first portion of the gate insulating film is thicker than a third portion of the gate insulating film located on the upper surface of the SiC layer. And an end portion of the gate electrode is located on the upper corner region.

13 Claims, 9 Drawing Sheets

(51) Int. Cl.
- *H01L 29/16* (2006.01)
- *H01L 21/04* (2006.01)
- *H01L 29/78* (2006.01)
- *H01L 29/812* (2006.01)
- *H01L 29/872* (2006.01)

(52) U.S. Cl.
CPC ........... *H01L29/872* (2013.01); *H01L 21/0475* (2013.01); *H01L 21/049* (2013.01); *H01L 29/66068* (2013.01); *H01L 29/7827* (2013.01)

(56) References Cited

U.S. PATENT DOCUMENTS

| | | | |
|---|---|---|---|
| 5,976,936 A * | 11/1999 | Miyajima et al. | 438/268 |
| 6,117,734 A | 9/2000 | Nakamura | |
| 6,228,720 B1 | 5/2001 | Kitabatake et al. | |
| 6,853,006 B2 * | 2/2005 | Kataoka et al. | 257/77 |
| 2001/0006836 A1 | 7/2001 | Nakamura et al. | |
| 2001/0053561 A1 | 12/2001 | Kitabatake et al. | |
| 2003/0203573 A1 | 10/2003 | Nakamura et al. | |
| 2005/0233539 A1 | 10/2005 | Takeuchi et al. | |
| 2008/0220620 A1 | 9/2008 | Kawada et al. | |
| 2010/0006861 A1 | 1/2010 | Yamamoto et al. | |
| 2010/0062582 A1 | 3/2010 | Fujikawa | |
| 2011/0017998 A1 | 1/2011 | Nakano et al. | |

FOREIGN PATENT DOCUMENTS

| | | |
|---|---|---|
| JP | 2000-277488 A | 10/2000 |
| JP | 2000-312003 A | 11/2000 |
| JP | 2007-043209 A | 2/2007 |
| JP | 2007-081057 A | 3/2007 |
| JP | 2007-207935 A | 8/2007 |
| JP | 2008-177538 A | 7/2008 |
| WO | 2008/065782 A1 | 6/2008 |

OTHER PUBLICATIONS

Form PCT/ISA/237 for corresponding International Application No. PCT/JP2012/005777 dated Oct. 23, 2012.

Chen et al., "Homoepitaxial Growth of 4H-SiC on Trenched Substrates by Chemical Vapor Deposition", Materials Science Forum, vols. 457-460 (2004) pp. 189-192.

* cited by examiner

FIG.1
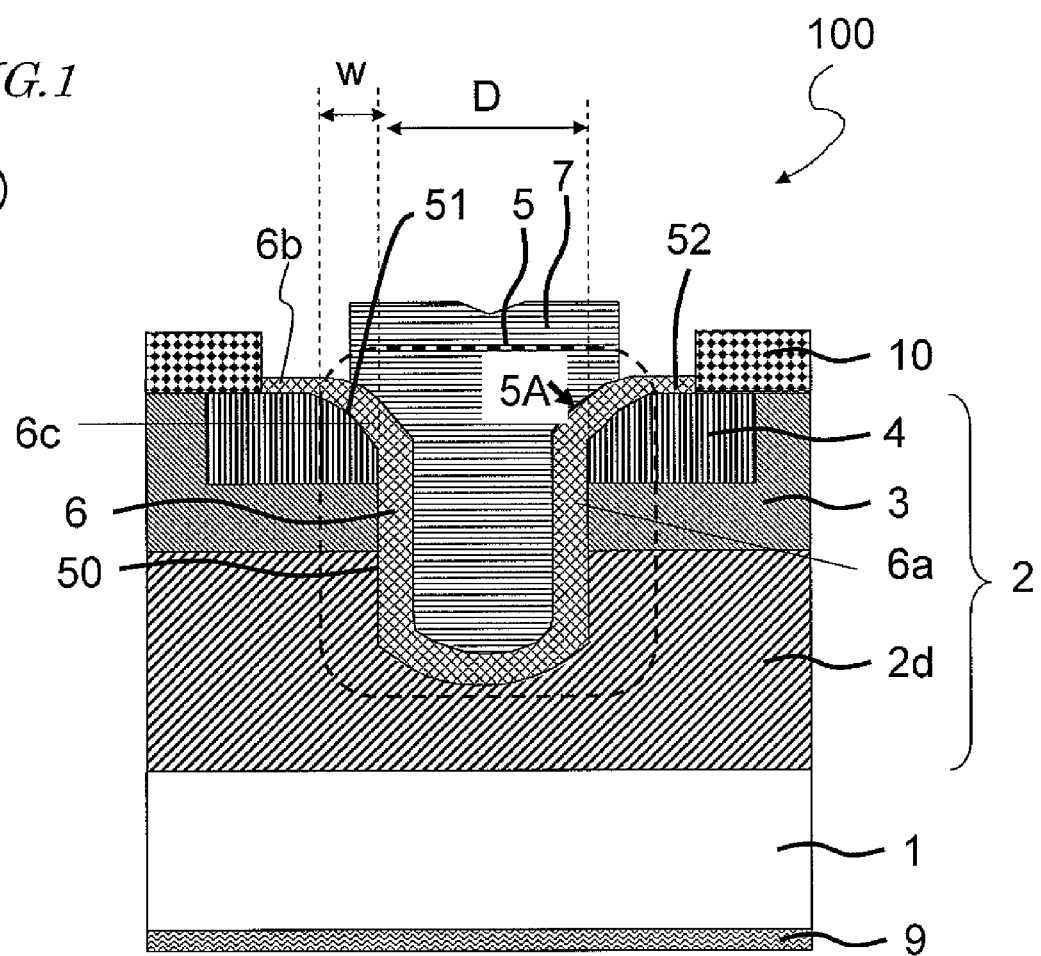
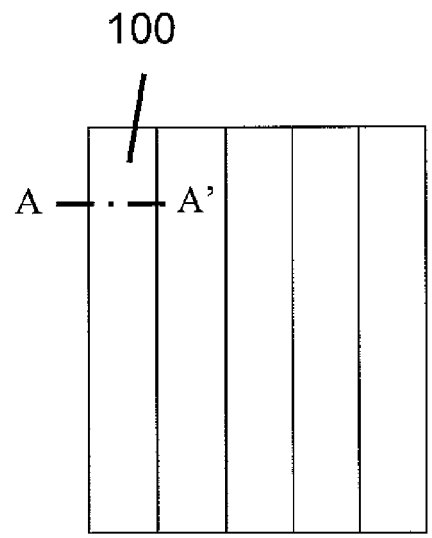

FIG.8
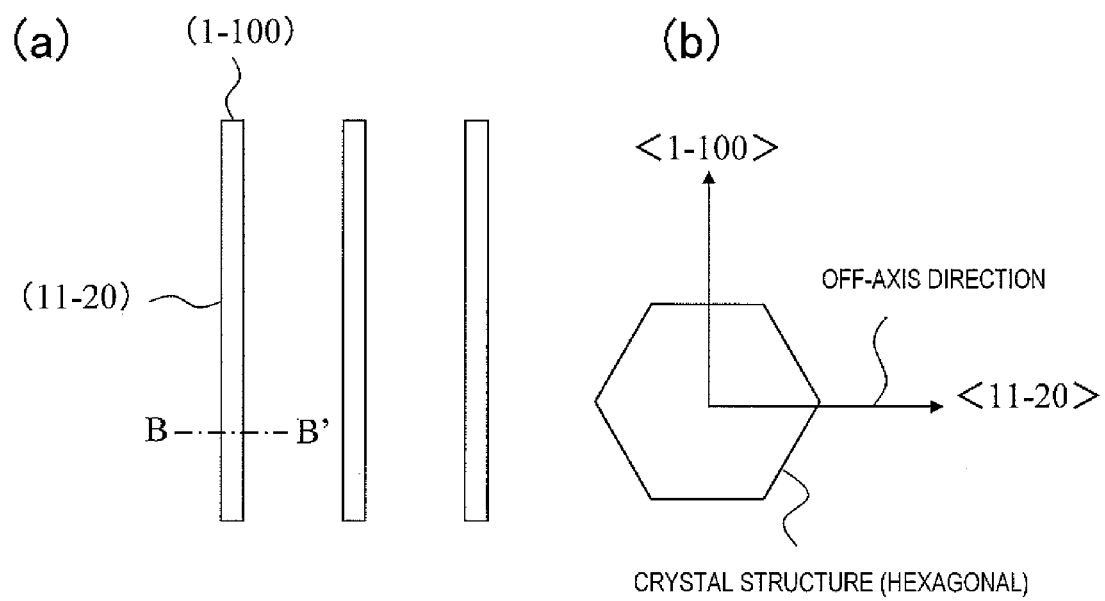
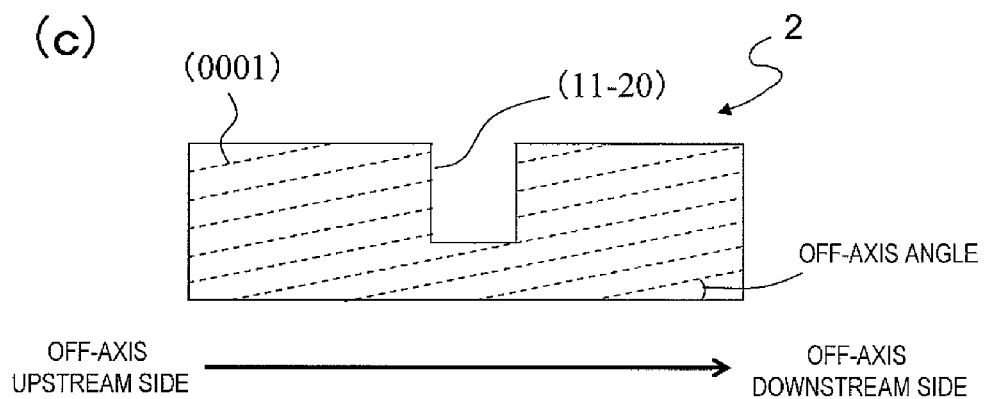

SILICON CARBIDE SEMICONDUCTOR ELEMENT AND METHOD FOR FABRICATING THE SAME

TECHNICAL FIELD

The present application relates to a semiconductor element that uses SiC and a method for fabricating such an element. More particularly, the present application relates to a silicon carbide semiconductor element (as a power semiconductor device) which can be used in applications that require a high breakdown voltage and a large amount of current.

BACKGROUND ART

Silicon carbide (SiC) has a broader band gap and a higher dielectric breakdown voltage than silicon (Si), and therefore, is expected to be the best semiconductor material to make a next-generation low-loss power device. SiC has a lot of poly-types including cubic ones such as 3C—SiC and hexagonal ones such as 6H—SiC and 4H—SiC. Among these various poly-types, the one that is used generally to make a practical silicon carbide semiconductor element is 4H—SiC.

Among various power devices that use SiC, field effect transistors such as a metal-insulator-semiconductor field effect transistor (which will be referred to herein as a "MIS-FET") and a metal-semiconductor field effect transistor (which will be referred to herein as a "MESFET") are known as typical switching elements. Such a switching element can switch between ON state in which drain current of several amperes (A) or more flows and OFF state in which the drain current becomes zero by changing the voltage applied to between its gate and source electrode. Also, in the OFF state, such a switching element will achieve as high a breakdown voltage as several hundred volts or more. As for rectifiers, a Schottky diode, a pn diode and other SiC rectifiers have already been reported and are all expected to be rectifiers that can operate with a huge amount of current and with a high breakdown voltage.

SiC has a higher dielectric breakdown voltage and a higher thermal conductivity than Si. That is why a power device that uses SiC (which will be referred to herein as a "SiC power device") can have a higher dielectric strength and will cause smaller loss than a Si power device. That is why if a SiC power device can have as high performance as a Si power device, the SiC power device can have much smaller area and thickness than the Si power device.

To make an even larger amount of current flow through a power device such as a MISFET, it is effective to increase the channel density. For that reason, a vertical power MISFET with a trench gate structure has been proposed as a replacement for a traditional planar gate structure. In the planar gate structure, a channel region is defined on the surface of a semiconductor layer. In the trench gate structure, on the other hand, a channel region is defined on the side surface of a trench that has been formed in a semiconductor layer.

Hereinafter, a cross-sectional structure of a vertical MISFET with the trench gate structure will be described with reference to the accompanying drawings. The vertical MISFET ordinarily has a plurality of unit cells that are arranged two-dimensionally. Each of those unit cells has a trench gate.

FIG. 10 is a cross-sectional view illustrating one cell pitch (i.e., a single unit cell) of a traditional vertical MISFET 1000 with the trench gate structure. In the example illustrated in FIG. 10, each unit cell has a trench gate, of which a side surface is substantially perpendicular to the principal surface of the substrate.

The vertical MISFET 1000 includes a substrate 1 of silicon carbide and a silicon carbide layer 2 that has been formed on the principal surface of the silicon carbide substrate 1. The silicon carbide layer 2 includes an n-type drift region 2d that has been defined on the principal surface of the silicon carbide substrate 1 and a p-type body region 3 that has been defined on the drift region 2d. An n-type source region 4 forms part of the surface region of the body region 3. A trench 5 has been formed in the silicon carbide layer 2 so as to run through the body region 3 and reach the drift region 2d. In this example, the trench 5 has a side surface that is perpendicular to the principal surface of the substrate 1. Inside of the trench 5, arranged are a gate electrode 7 and a gate insulating film 6 that insulates the gate electrode 7 from the silicon carbide layer 2. Further arranged on the silicon carbide layer 2 is a source electrode 10 that contacts with the source region 4 and a body region 3. And a drain electrode 9 is arranged on the back surface of the silicon carbide substrate 1.

A vertical MISFET like this may be fabricated in the following manner.

First of all, on the principal surface of an n-type silicon carbide substrate 1 with low resistivity, formed is a silicon carbide layer 2 having the same crystal structure as the silicon carbide substrate 1. For example, an n-type drift region 2d and a p-type body region 3 are defined in this order by epitaxial growth process on the principal surface of the silicon carbide substrate 1, thereby obtaining a silicon carbide layer 2. After that, a mask layer (not shown) of silicon dioxide is put on a predetermined area of the silicon carbide layer 2 and used as a mask through which n-type dopant ions (such as N (nitrogen) ions) are implanted into the body region 3, thereby defining a source region 4 in the body region 3.

After the mask has been removed, an Al film (not shown) is deposited on a part of the source region 4 with an oxide film interposed between them, and used as a mask, through which a trench 5 is cut to reach the drift region 2d.

Next, a gate insulating film 6 and a gate electrode 7 are formed in this order inside of the trench 5. The gate insulating film 6 may be an oxide film, which is obtained by thermally oxidizing the silicon carbide layer 2.

The gate electrode 7 may be formed 6 by depositing polysilicon on the gate insulating film 6 by low pressure chemical vapor deposition (LP-CVD) process and then patterning it, for example. Meanwhile, a source electrode 10 is formed on the silicon carbide layer 2 to cover both the body region 3 and the source region 4, while a drain electrode 9 is formed on the back surface of the silicon carbide substrate 1. In this manner, a vertical MISFET with a trench gate structure is completed.

In a MISFET with such a trench gate structure, when the source electrode 10 and the gate electrode 7 are both grounded or when a negative bias voltage is applied to the gate electrode 7, holes are induced and stored in the vicinity of the interface between the body region 3 and the gate insulating film 6 in the region between the source region 4 and the drift region 2d, and the path of electrons which are conduction carriers is cut off. As a result, no current flows (i.e., the MISFET turns OFF). In this case, if a high voltage is applied to between the drain electrode 9 and the source electrode 10 so that the drain electrode 9 has positive potential, then the PN junction between the body region 3 and the drift region 2d becomes reverse biased. As a result, a depletion layer expands in the body region 3 and in the drift region 2d and a high voltage can be maintained.

On the other hand, if a positive bias voltage that is equal to or higher than a threshold voltage is applied to the gate electrode 7, electrons are induced and inverted in the vicinity of the interface between the body region 3 and the gate insulating film 6 in the region between the source region 4 and the drift region 2d, and an inversion layer is formed there. As a result, carriers flow from the source electrode 10 toward the drain electrode 9 by way of the source region 4, the inversion layer (not shown) that that has been formed in the body region 3 and that contacts with the gate insulating film 6, the drift region 2d and the silicon carbide substrate 1. That is to say, the MISFET turns ON.

In a vertical MISFET with the planar structure, a junction field effect transistor (which will be abbreviated herein as "JFET") is formed as a parasitic transistor between adjacent unit cells and produces a resistive component (JFET resistance). This JFET resistance is produced when current flows through the drift region that is interposed between adjacent body regions. The narrower the interval between those unit cells (i.e., the narrower the gap between the adjacent body regions), the greater the JFET resistance. That is why if the cell pitch is reduced to cut down the size, the ON-state resistance increases as the JFET resistance rises.

On the other hand, since the MISFET 1000 with the trench gate structure has no JFET resistance, the ON-state resistance decreases monotonically as the cell pitch is reduced, which is beneficial. For that reason, to cut down the size of a unit cell, it is more advantageous to adopt a MISFET with the trench gate structure.

However, in a MISFET 1000 with such a trench gate structure, the gate insulating film 6 on the inner wall of the trench 5 may have its reliability decreased due to some damage or contamination inside the trench 5, which is a problem. In addition, since the electric field intensity easily becomes excessively high at a corner portion 5A at the rim of the trench 5 and at a corner portion 5B at the bottom of the trench 5, a decrease in the breakdown voltage of the device could be caused.

To overcome such a problem, people proposed a method for smoothing and rounding such corner portions of the trench 5 by cutting the trench through a silicon carbide layer by dry etching and then conducting a heat treatment process (see Patent Document No. 1, for example). In this description, "to round" means turning a corner portion (such as a corner or an edge) into a rounder shape. Furthermore, other people proposed embedding an $SiO_2$ film on the bottom of a trench in order to secure an even higher breakdown voltage at the bottom of the trench (see Patent Document No. 2, for example).

CITATION LIST

Patent Literature

Patent Document No. 1: Japanese Laid-Open Patent Publication No. 2008-177538
Patent Document No. 2: Japanese Laid-Open Patent Publication No. 2007-207935

SUMMARY OF INVENTION

Technical Problem

According to the methods proposed in Patent Documents Nos. 1 and 2, it is possible to prevent the electric field intensity from becoming excessively high at a corner portion or a bottom of a trench, and increase the degree of reliability of the gate insulating film, by smoothing the inner wall of the trench, rounding the corner portion of the trench or embedding an $SiO_2$ film on the bottom of the trench. However, the present inventors discovered via experiments that a decrease in the breakdown voltage of a semiconductor element could not be checked sufficiently in some cases by such traditional methods (as will be described in detail later). Thus, there is a growing demand for further raising the breakdown voltage of a semiconductor element with a trench gate structure.

The present application provides a non-limiting, exemplary embodiment of a silicon carbide semiconductor element which has such a trench gate structure that can increase the gate breakdown voltage while keeping the gate electrode sufficiently wide.

Solution to Problem

An aspect of the present invention is a silicon carbide semiconductor element which includes: a silicon carbide substrate which has a principal surface tilted with respect to a (0001) Si plane; a silicon carbide layer which is arranged on the principal surface of the silicon carbide substrate; a trench which in arranged in the silicon carbide layer and which has a bottom, a sidewall, and an upper corner region that is located between the sidewall and the upper surface of the silicon carbide layer; a gate insulating film which is arranged on at least a part of the sidewall and on at least a part of the upper corner region of the trench and on at least a part of the upper surface of the silicon carbide layer; and a gate electrode which is arranged on the gate insulating film. The upper corner region has a surface which is different from the upper surface of the silicon carbide layer and from a surface that defines the sidewall. The gate electrode contacts with both of a first portion of the gate insulating film located on the upper corner region and a second portion of the gate insulating film located on the sidewall. The first portion of the gate insulating film is thicker than a third portion of the gate insulating film which is located on the upper surface of the silicon carbide layer. And an end portion of the gate electrode is located on the upper corner region.

Advantageous Effects of Invention

A silicon carbide semiconductor element as an aspect of the present invention has a trench at a (0001) Si plane and the trench has an upper corner region, which is defined by a different surface from the Si plane or a surface that defines the sidewall of the trench, over the sidewall. That is why the gate insulating film can be thicker on the upper corner region than on the upper surface of the silicon carbide layer (i.e., on the Si plane). On top of that, since the end portion of the gate electrode is located on the upper corner region, it is possible to prevent the gate electrode from contacting with the gate insulating film on the Si plane. Consequently, it is possible to prevent the intensity of the electric field from becoming excessively high on the upper surface of the silicon carbide layer and at a corner portion of the upper part of the trench's sidewall. As a result, the gate breakdown voltage can be higher than in the related part.

BRIEF DESCRIPTION OF DRAWINGS

FIG. 1 Illustrates conceptually a silicon carbide semiconductor element as a first exemplary embodiment, wherein (a) is a cross-sectional view and (b) is a plan view illustrating an exemplary arrangement in which rectangular unit cells run.

FIG. 8(a) through (c) are schematic representations showing a relation between the off-axis direction of a silicon carbide substrate according to the second embodiment and the plane orientation of a channel surface of a trench, which (a) is a plan view, (b) is an enlarged plan view, and (c) is a an enlarged cross-sectional view of the silicon carbide layer.

DESCRIPTION OF EMBODIMENTS

In a semiconductor element with the trench gate structure, a decrease in the breakdown voltage of the semiconductor element may not be checked sufficiently simply by taking the excessive high intensity of an electric field at the corner and bottom portions of the trench into consideration. The present inventors discovered via experiments that a semiconductor element with a traditional trench gate structure sometimes has its breakdown voltage decreased due to an excessive high intensity of an electric field at a planar surface with no trenches.

Figure 10:
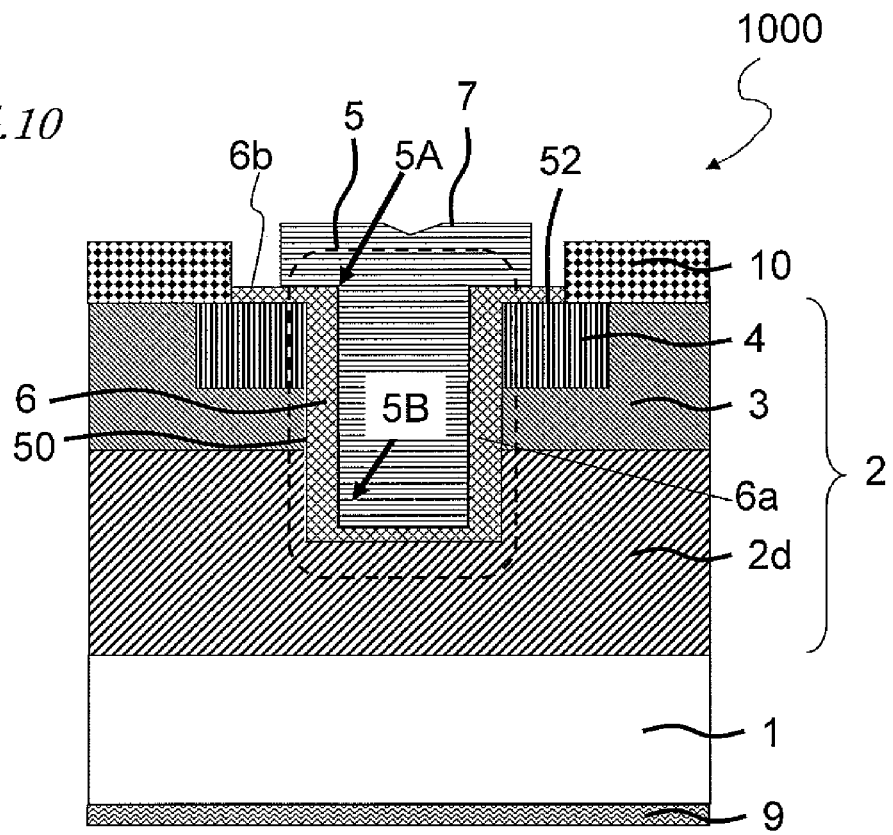
FIG. 10 A schematic cross-sectional view illustrating a trenched MISFET with a traditional ordinary trench gate structure.

It will be described in detail with reference to FIG. 10 how such a problem arises when a trenched MISFET 1000 is fabricated on a (0001) Si plane of a silicon carbide substrate 1, for example. If a gate insulating film 6 is formed by thermally oxidizing silicon carbide, a portion 6b of the gate insulating film 6 on a planar surface (Si plane) 52, which is the upper surface of the silicon carbide layer 2, comes to have a thickness of 20 nm, for example, which is much smaller than the thickness (e.g., 70 nm) of a portion 6a of the gate insulating film 6 on the sidewall 50 of the trench 5. The thickness of that portion 6b on the planar surface 52 is approximately 0.2 to 0.3 times as large as that of the portion 6a on the sidewall 50. And if a gate electrode 7 is formed on that portion 6b on the planar surface 52, the intensity of an electric field applied to the gate insulating film 6 when the MISFET is operated with a gate voltage of 20 V will be as high as 10 MV/cm (=20 V÷20 nm). That is why the gate insulating film 6 could deteriorate or get broken down on the planar surface 52.

Meanwhile, according to Si technologies, a structure in which a gate electrode is arranged to fill only a trench and not to cover the upper surface of a Si layer has also been proposed. According to such a method, however, the width of the gate electrode is defined by that of the trench. That is why as the gate electrode comes to have too small a cross-sectional area, the gate resistance could increase and the switching rate could decrease in some cases. Also, to form such an embedded gate electrode, an additional process step of etching back the gate electrode by either dry etching or polishing needs to be performed, and such a process step has so narrow a process margin that the yield could decrease.

To overcome these problems, the present inventors perfected our invention by finding a structure that can increase the gate breakdown voltage by avoiding an excessive high intensity of an electric field at the planar surface with the gate electrode kept sufficiently wide for a silicon carbide semiconductor element with a trench gate structure.

An aspect of the present invention is outlined as follows:

A silicon carbide semiconductor element according to an aspect of the present invention includes: a silicon carbide substrate which has a principal surface tilted with respect to a (0001) Si plane; a silicon carbide layer which is arranged on the principal surface of the silicon carbide substrate; a trench is arranged in the silicon carbide layer and which has a bottom, a sidewall, and an upper corner region that is located between the sidewall and the upper surface of the silicon carbide layer; a gate insulating film which is arranged on at least a part of the sidewall and on at least a part of the upper corner region of the trench and on at least of a part of the upper surface of the silicon carbide layer; and a gate electrode which is arranged on the gate insulating film. The upper corner region has a surface which is different from the upper surface of the silicon carbide layer and from a surface that defines the sidewall. The gate electrode contacts with both of a first portion of the gate insulating film located on the upper corner region and a second portion of the gate insulating film located on the sidewall. The first portion of the gate insulating film is thicker than a third portion of the gate insulating film which is located on the upper surface of the silicon carbide layer. And an end portion of the gate electrode is located on the upper corner region.

The silicon carbide semiconductor element further includes a silicon carbide epitaxial layer which is arranged between the trench and the gate insulating film. The silicon carbide epitaxial layer has an epi-layer's upper corner region which is located on the upper corner region. And the end portion of the gate electrode is located on the epi-layer's upper corner region.

On a cross section which intersects at right angles with not only the principal surface of the silicon carbide substrate but also the sidewall of the trench, the principal surface may be tilted with respect to the (0001) Si plane, the epi-layer's upper corner region may include a first epi-layer's upper corner region and a second epi-layer's upper corner region which faces the first epi-layer's upper corner region and which is located in a direction, toward which the (0001) Si plane tilted rises with respect to the principal surface of the silicon carbide substrate, compared to the first epi-layer's upper corner region, and the width of the first epi-layer's upper corner region may be greater than that of the second epi-layer's upper corner region.

When viewed along a normal to the principal surface of the silicon carbide substrate, the width of a portion of the first epi-layer's upper corner region which is overlapped by the gate electrode may be greater than that of a portion of the second epi-layer's upper corner region which is overlapped by the gate electrode.

On a cross section which intersects at right angles with the principal surface of the silicon carbide substrate, the upper corner region has a width of 0.1 μm to 1 μm, for example.

The principal surface of the silicon carbide substrate is tilted in a <11-20> direction with respect to the (0001) Si plane and the plane orientation of the trench's sidewall is {11-20}, for example.

The principal surface of the silicon carbide substrate is tilted in a <1-100> direction with respect to the (0001) Si plane and the plane orientation of the trench's sidewall is {1-100}, for example.

The principal surface of the silicon carbide substrate defines a tilt angle of 0.1 to 10 degrees with respect to the (0001) Si plane, for example.

The gate insulating film may include a thermal oxide film.

A method for fabricating a silicon carbide semiconductor element as another aspect of the present invention includes the steps of: providing a silicon carbide substrate which has a principal surface tilted with respect to a (0001) Si plane, a silicon carbide layer being arranged on the principal surface; forming a trench in the principal surface of the silicon carbide layer, the trench having a bottom, a sidewall, and an upper corner region that is located between the sidewall and the upper surface of the silicon carbide layer, the upper corner region having a surface which is different from the upper surface of the silicon carbide layer and from a surface that defines the sidewall; forming a gate insulating film on at least a part of the sidewall and on at least of the upper corner region of the trench and on at least a part of the upper surface of the silicon carbide layer, a first portion of the gate insulating film which is located on the upper corner region being thicker than a third portion of the gate insulating film which is located on the upper surface of the silicon carbide layer; and forming a gate electrode on the gate insulating film so that the gate electrode contacts with both the first portion of the gate insulating film and a second portion of the gate insulating film which is located on the sidewall and that an end portion of the gate electrode is located on the upper corner region.

The method for fabricating a silicon carbide semiconductor element may further include, after the step of forming a trench in the silicon carbide layer and before the step of forming a gate insulating film, the step of forming a silicon carbide epitaxial layer on at least a part of the sidewall and on at least a part of the upper corner region of the trench.

The silicon carbide epitaxial layer has an epi-layer's upper corner region which is located on the upper corner region. The end portion of the gate electrode is located on the epi-layer's upper corner region. On a cross section which intersects at right angles with not only the principal surface of the silicon carbide substrate but also the sidewall of the trench, the principal surface is tilted with respect to the (0001) Si plane, the epi-layer's upper corner region includes a first epi-layer's upper corner region and a second epi-layer's upper corner region which faces the first epi-layer's upper corner region and which is located in a direction, toward which the (0001) Si plane tilted rises with respect to the principal surface of the silicon carbide substrate, compared to the first epi-layer's upper corner region, and the width of the first epi-layer's upper corner region is greater than that of the second epi-layer's upper corner region. The gate electrode is formed so that when viewed along a normal to the principal surface of the silicon carbide substrate, the width of a portion of the first epi-layer's upper corner region which is overlapped by the gate electrode is greater than that of a portion of the second epi-layer's upper corner region which is overlapped by the gate electrode.

The step of forming a trench in the silicon carbide layer includes, for example, the steps of: forming a recess in the silicon carbide layer; and subjecting the silicon carbide layer, in which the recess has been formed, to a heat treatment and forming the upper corner region at the corner of the recess' rim, thereby making the trench.

Hereinafter, embodiments of a silicon carbide semiconductor element and method for fabricating it according to the present invention will be described in detail with reference to the accompanying drawings.

Embodiment 1

The structure of a silicon carbide semiconductor element as a first embodiment will be described specifically with reference to FIG. 1. The silicon carbide semiconductor element of this embodiment is a silicon carbide MISFET with a trench gate structure.

The silicon carbide semiconductor element of this embodiment includes a plurality of unit cells that are arranged two-dimensionally. FIG. 1(a) is a cross-sectional view illustrating one of those unit cells 100 and FIG. 1(b) is a plan view illustrating an exemplary arrangement of the unit cell 100 on the surface of the silicon carbide layer of the semiconductor element. FIG. 1(a) is a cross-sectional view as viewed on the plane A-A' shown in FIG. 1(b).

The unit cell 100 includes a silicon carbide substrate 1 with a (0001) Si plane. In this embodiment, the unit cell 100 further includes a silicon carbide layer (such as an epitaxial layer) 2 which is arranged on the (principal) surface of the silicon carbide substrate 1 and which is made of silicon carbide. The upper surface 52 of the silicon carbide layer 2 is a (0001) Si plane. In this embodiment, an n-type SiC substrate may be used as the silicon carbide substrate 1. The principal surface of the silicon carbide substrate 1 is a (0001) Si plane.

The silicon carbide layer 2 has a drift region 2d of a first conductivity type (e.g., n-type in this example) which is defined on the principal surface of the silicon carbide substrate 1, and a body region 3 of a second conductivity type (e.g., p-type in this example) which is defined on the drift region 2d. Also, a source region 4 of the first conductivity type (n-type) is arranged to form part of the surface region of the body region 3. In the example illustrated in FIG. 1, the source region 4 is surrounded with the body region 3 on the upper surface of the silicon carbide layer 2.

Through the upper surface (Si plane) 52 of the silicon carbide layer 2, a trench 5 has been cut to run through the body region 3 and the source region 4 and reach the drift region 2d. The trench 5 has an upper corner region 51, which is defined by a surface that is different from the upper surface 52 (which is an Si plane in this example) of the silicon carbide layer 2 and from the surface of the sidewall 50, between the sidewall 50 of the trench 5 and the upper surface 52 of the silicon carbide layer 2. The upper corner region 51 is arranged at the corner (i.e., the edge portion) 5A of the rim of the trench 5. Also, the upper corner region 51 may be arranged in the source region 4 but may not be arranged in the body region 3. Then, the gate insulating film 6 on the surface region (channel portion) of the body region 3, which is exposed on the sidewall 50 of the trench 5, can be controlled to have a predetermined thickness. As a result, the intended transistor performance is realized as expected. The upper corner region 51 may have either a curved surface or a flat surface. In this example, the upper corner region 51 is a round region with a round shape. In this description, the "round region" refers to a region with some degree of roundness (e.g., a region with a curved surface having a radius of curvature of 0.1 μm or more). It should be noted that in this description, the "surface" of the upper corner region 51 such as a round region does not refer to planes which are much smaller than the thickness of the gate insulating film 6 such as microscopic (or atomic level) planes (e.g., planes that form very small micro-steps).

The gate insulating film 6 is arranged to cover the sidewall 50 of the trench 5 (or the sidewall of the body region 3 to say the least), the upper corner region 51, and the upper surface (Si plane) 52 of the silicon carbide layer 2. The gate insulating film 6 may be either a silicon dioxide film which has been formed by thermal oxidation or a silicon dioxide film including nitrogen (N). A portion (which will be referred to herein as a "first portion") 6c of the gate insulating film 6 on the upper corner region 51 is thicker than another portion (which will be referred to herein as a "third portion") 6b of the gate insulating film 6 on the Si plane 52. In addition, in this example, a portion (which will be referred to herein as a "second portion") 6a of the gate insulating film 6 on the sidewall 50 is also thicker than the third portion 6b. It should be noted that the thickness of the second portion 6a of the gate insulating film 6 is measured on a part of the sidewall 50 on the body region 3.

Inside the trench 5, a gate electrode 7 is arranged to contact with the first and second portions 6c and 6a of the gate insulating film 6. The gate electrode 7 and the silicon carbide layer 2 is electrically insulated from each other by the gate insulating film 6.

On the silicon carbide layer 2, a source electrode 10 is arranged in common for the source and body so as to contact with both the body region 3 and the source region 4. On the other hand, a drain electrode 9 is arranged on the back surface of the silicon carbide substrate 1.

According to this embodiment, the gate electrode 7 with a broader width than the trench 5 can be arranged on the first and second portions 6c and 6a of the gate insulating film 6 that have a predetermined thickness, and therefore, the intensity of the electric field generated in the gate insulating film does not become excessively high.

The gate electrode 7 is not arranged on the third portion 6b of the gate insulating film 6 but the end portion of the gate electrode 7 is located on the upper corner region 51. As a result, it is possible to prevent even more securely the gate electrode 7 from making electrical contact with that portion 6b of the gate insulating film 6 on the Si plane 52, and therefore, the breakdown voltage can be increased even more effectively.

On a cross section which intersects at right angles with the principal surface of the silicon carbide substrate 1, the upper corner region 51 suitably has a width w of 0.1 μm to 1 μm The reason is that if the width w is equal to or greater than 0.1 μm, the gate electrode 7 can be patterned on the upper corner region 51 with plenty of margin, considering the alignment precision of an exposure system for use in a photolithographic process, and therefore, a decrease in yield due to misalignment can be minimized. On the other hand, if the width w is equal to or smaller than 1 μm, the size of each unit cell can be small enough to increase the number of elements integrated together in a single device.

In the example illustrated in FIG. 1, on a cross section which intersects at right angles with the principal surface of the silicon carbide substrate 1, an end portion of the upper surface 52 of the silicon carbide layer 2, which is located close to the trench 5, is arranged over the upper end of the sidewall 50 of the trench 5 and outside of the trench 5. In this example, the upper corner region 51 is a flat surface, a curved surface or a combination thereof which is arranged so as to connect together the upper end of the sidewall 50 of the trench 5 and the end portion of the upper surface 52 of the silicon carbide layer 2 close to the trench 5.

Hereinafter, a method for fabricating a semiconductor element according to this embodiment will be described in detail with reference to FIG. 2, which is a series of cross-sectional views illustrating respective manufacturing process steps that need to be performed to fabricate a silicon carbide semiconductor element as the first embodiment of the present invention.

First of all, as shown in FIG. 2(a), a silicon carbide substrate 1, of which the surface is covered with a silicon carbide layer 2 including a drift region 2d, a body region 3 and a source region 4, is provided, and a trench 5 is cut through this silicon carbide layer 2.

In this embodiment, an n-type 4H—SiC substrate which defines an off-axis angle of 4 degrees with respect to a (0001) plane is used as the silicon carbide substrate 1. On a (0001) Si plane of this silicon carbide substrate 1, the silicon carbide layer 2 is grown epitaxially. The silicon carbide layer 2 has a carrier concentration of $8 \times 10^{15}$ cm$^{-3}$ and a thickness of 12 μm, for example. Nitrogen may be used as an n-type dopant.

Thereafter, a p-type body region 3 is defined in the surface region of the silicon carbide layer 2. The body region 3 may have a carrier concentration of $2 \times 10^{18}$ cm$^{-3}$ and a thickness of 1 μm, for example. The body region 3 can be formed by implanting p-type dopant ions (such as Al ions) into the silicon carbide layer 2. The rest of the silicon carbide layer 2, in which the body region 3 has not been formed, becomes the drift region 2d. Optionally, the body region 3 may be formed on the n-type silicon carbide layer 2 by being epitaxially grown with a p-type dopant (such as trimethylaluminum) supplied.

Next, an n-type source region 4 is defined in the body region 3. The source region 4 may be formed by implanting n-type dopant ions (such as N ions) into the body region 3 through a mask layer (not shown) of silicon dioxide or polysilicon which is arranged on the silicon carbide layer 2. After that, an annealing process is carried out at a temperature of 1700° C. for approximately 30 minutes within an inert gas atmosphere. By performing this annealing process, the body region 3 and the source region 4 can be activated.

Next, a trench (or a recess) 5 is formed in the silicon carbide layer 2 to run through the source region 4 and the body region 3 and to have a bottom in the drift region 2d. In this embodiment, first of all, a mask layer such as a plasma oxide film (not shown) is formed selectively on the source region 4 and a reactive ion etching (RIE) process is carried out using that mask layer. In this manner, a trench 5 (with a depth of 1.5 μm and a width of 1 μm, for example) is formed in the silicon carbide layer 2. In the example illustrated in FIG. 2, the sidewall of the trench 5 is substantially perpendicular to the principal surface of the silicon carbide substrate 1. However, the trench 5 may also have a side surface which is tilted with respect to a normal to the principal surface of the silicon carbide substrate 1 (i.e., may have either a tapered shape or an inverted tapered shape).

Next, as shown in FIG. 2(b), an upper corner region 51 is formed at the corner of the trench's (5) rim. In this example, a round region with some roundness is formed.

Specifically, the silicon carbide substrate 1 with the silicon carbide layer 2 is subjected to an annealing process at a temperature of 1530° C. and under a pressure of 200 mbar within an argon (Ar) gas atmosphere, for example. The annealing process time may be 10 minutes, for example. By performing this annealing process, a surface diffusion phenomenon of SiC arises, thereby rounding the corner of the trench's rim and forming the upper corner region 51. The upper corner region 51 may have a radius of curvature of approximately 0.5 μm, for example. In addition, by performing this annealing process, the damage done on the crystals at the surface of the trench and sub-trenches to be formed at the corner of the trench's bottom through the RIE process can be removed. At the same time, the corner portion 5B at the bottom of the trench is also rounded as a result of this annealing process.

The annealing process does not have to be carried out under this condition. The gas atmosphere may be an inert gas atmosphere such as argon gas, a hydrogen atmosphere, a chlorine based gas atmosphere or a mixture thereof. For example, an argon inert gas atmosphere may be used. The annealing temperature is not particularly limited, either, but is suitably within the range of 1500° C. to 1600° C., for example. If the annealing temperature is equal to or higher than 1500° C., the corner portion of the trench 5 can get rounded in as short as one hour or less. And if the annealing temperature is equal to or lower than 1600° C., it is possible to prevent noticeable surface roughening such as step bunching or Si missing from occurring on the surface of the silicon carbide layer 2. It should be noted that as long as the depth and width of the trench fall within permissible ranges for the device design, the annealing process condition may be appropriately adjusted as well.

Figure 2:
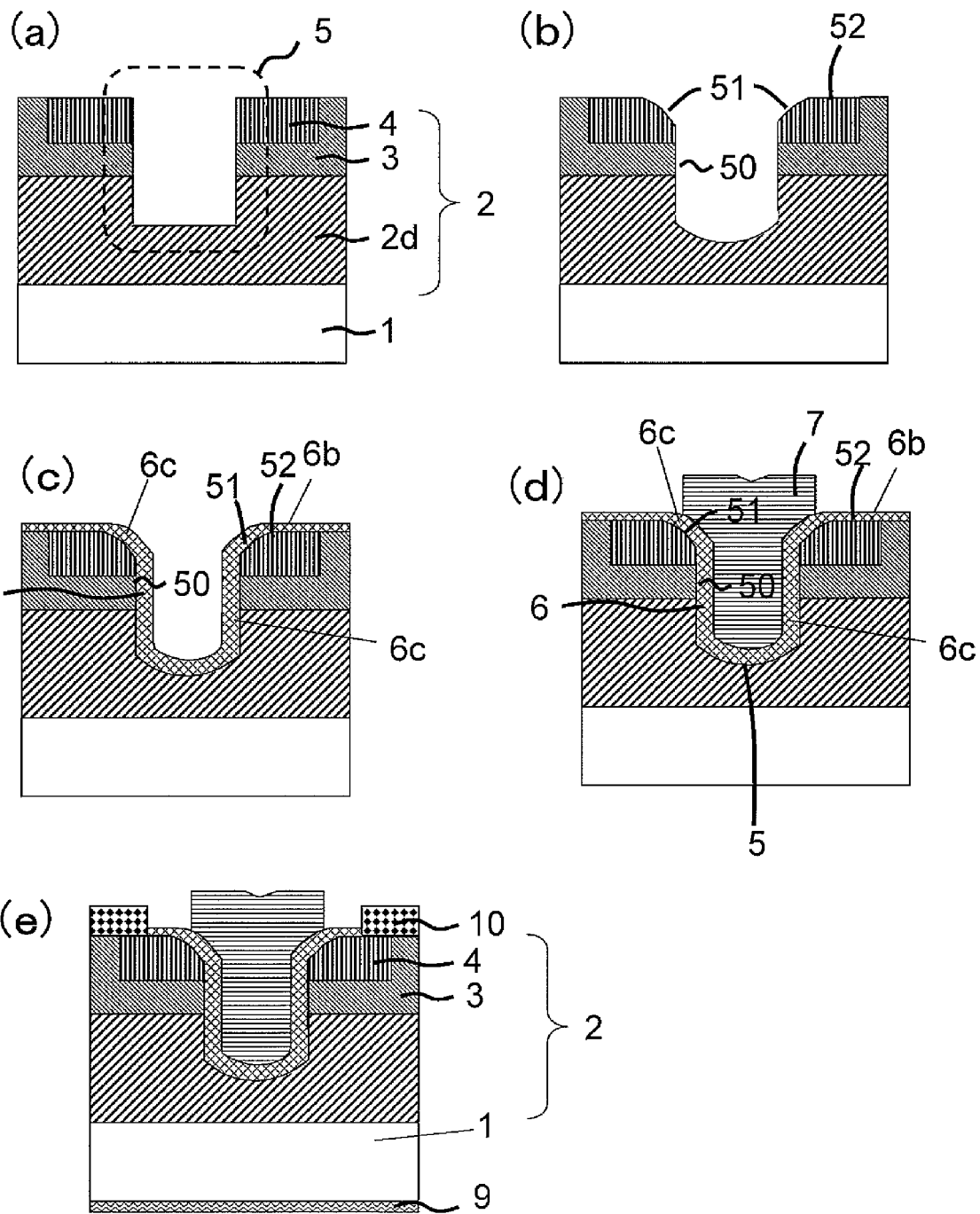
FIG. 2(a) through (e) are cross-sectional views illustrating respective manufacturing process steps that need to be performed to fabricate a silicon carbide semiconductor element according to the first exemplary embodiment.

Next, as shown in FIG. 2(c), a gate insulating film 6 is formed on the sidewall 50, bottom, and upper corner region 51 of the trench 5. In the example illustrated in FIG. 2, the gate insulating film 6 is also formed to cover the upper surface (Si plane) of the silicon carbide layer 2 that surrounds the trench 5.

In this example, the silicon carbide substrate 1, through which the trench 5 has already been cut, is washed, and then loaded into an oxidation furnace, where the substrate 1 is processed at 1200° C. for half an hour under a dry oxidizing atmosphere, for example. As a result, a silicon dioxide film (thermal oxide film) is formed as the gate insulating film 6 on the sidewall 50, bottom, and upper corner region 51 of the trench 5 and on the upper surface 52. The silicon dioxide film may have a thickness of 70 nm on the sidewall 50 of the trench 5, for example. At the upper corner region 51, on the other hand, the silicon dioxide film may have a thickness of 60 nm, for example. And the planar surface (Si plane) 52 gets covered with the silicon dioxide film with a thickness of 20 nm. Optionally, the gate insulating film 6 may be a silicon dioxide film including nitrogen. In that case, the number of interface levels can be reduced at the interface of the gate insulating film and an increase in channel mobility can be expected.

Next, as shown in FIG. 2(d), a gate electrode 7 is formed to fill the trench 5 and to cover the upper surface of the silicon carbide layer 2. Specifically, phosphorus (P) doped polysilicon is deposited to 800 nm, for example, over the entire surface of the wafer by LP-CVD process, and then an RTA process is carried out at 1000° C. for 60 seconds within an inert gas atmosphere, thereby activating phosphorus. Thereafter, a mask layer of photoresist, for example (not shown), is formed so as to expose the entire surface but regions with the trenches 5. Subsequently, polysilicon is etched by RIE process, thereby forming the gate electrodes 7. In this embodiment, each of those gate electrodes 7 is formed to contact with the portion 6c of the gate insulating film 6 on the upper corner region 51 and with the portion 6a of the gate insulating film 6 on the sidewall 50 of the trench 5. But the gate electrode 7 does not contact with the thin portion 6b of the gate insulating film 6 on the planar surface 52 (Si plane) of the gate insulating film 6.

Next, as shown in FIG. 2(e), a source electrode 10 is formed so as to contact with the body region 3 and the source region 4. The source electrode 10 is arranged on the upper surface of the silicon carbide layer 2 to cover both the body region 3 and the source region 4. Specifically, first of all, an interlevel dielectric film (not shown) is deposited over the silicon carbide layer 2 and the gate electrode 7. Next, a hole is cut through the interlevel dielectric film to partially expose the source region 4 and the body region 3. Then, the hole is filled with a conductive film (which is a metal film such as a Ti film, for example) and an annealing process is performed if necessary. As a result, a source electrode 10 that makes ohmic contact with the source region 4 and the body region 3 can be obtained.

Meanwhile, a drain electrode 9 is formed on the back surface (which is opposite to the principal surface) of the silicon carbide substrate 1. In this manner, a MISFET with a trench gate structure is obtained.

As described above, the gate insulating film 6 on the planar surface (Si plane) 52 becomes approximately 0.25 to 0.3 times as thick as itself on the sidewall 50 of the trench 5. However, the gate insulating film 6 at the upper corner region 51 becomes approximately 0.5 to 1.0 time as thick as itself on the sidewall 50 of the trench 5. Consequently, a thicker oxide film can be formed on the upper corner region 51 than on the upper surface 52.

In addition, the gate electrode 7 is formed so as to contact with the gate insulating film 6 on the upper corner region 51 and on the sidewall 50 of the trench 5 but not to contact with the gate insulating film 6 on the planar surface (Si plane) 52. As a result, a sufficiently high gate breakdown voltage can be secured even more effectively. More specifically, if the MISFET is operated with a gate voltage of 20 V, the intensity of an electric field applied to the gate insulating film 6 at the upper corner region will be as low as 3.3 MV/cm (=20 V÷60 nm). Thus, it is possible to prevent the gate insulating film 6 from getting broken down.

Furthermore, according to this embodiment, on a cross section which intersects at right angles with the principal surface of silicon carbide substrate 1, the gate electrode 7 can be formed to have an increased width (e.g., greater than the width D of the trench 5). As a result, the gate resistance can be reduced to a reasonably low level, and therefore, the switching performance can be kept sufficiently high. In this description, the "width of the gate electrode 7" refers to the distance between two end portions of the pattern of the gate electrode 7 which is arranged on the silicon carbide layer 2 to fill the trench 5 on a cross section that intersects with the principal surface of the silicon carbide substrate 1 at right angles.

In addition, by performing an annealing process to form the upper corner region 51 (i.e., a rounded region), RIE damage done on the trench 5 has been removed. As a result, the gate insulating film 6 can have a high degree of reliability.

Even though the entire gate insulating film 6 is supposed to be a thermal oxide film in the embodiment described above, the gate insulating film 6 may also include a non-thermal oxide film.

Figure 3:
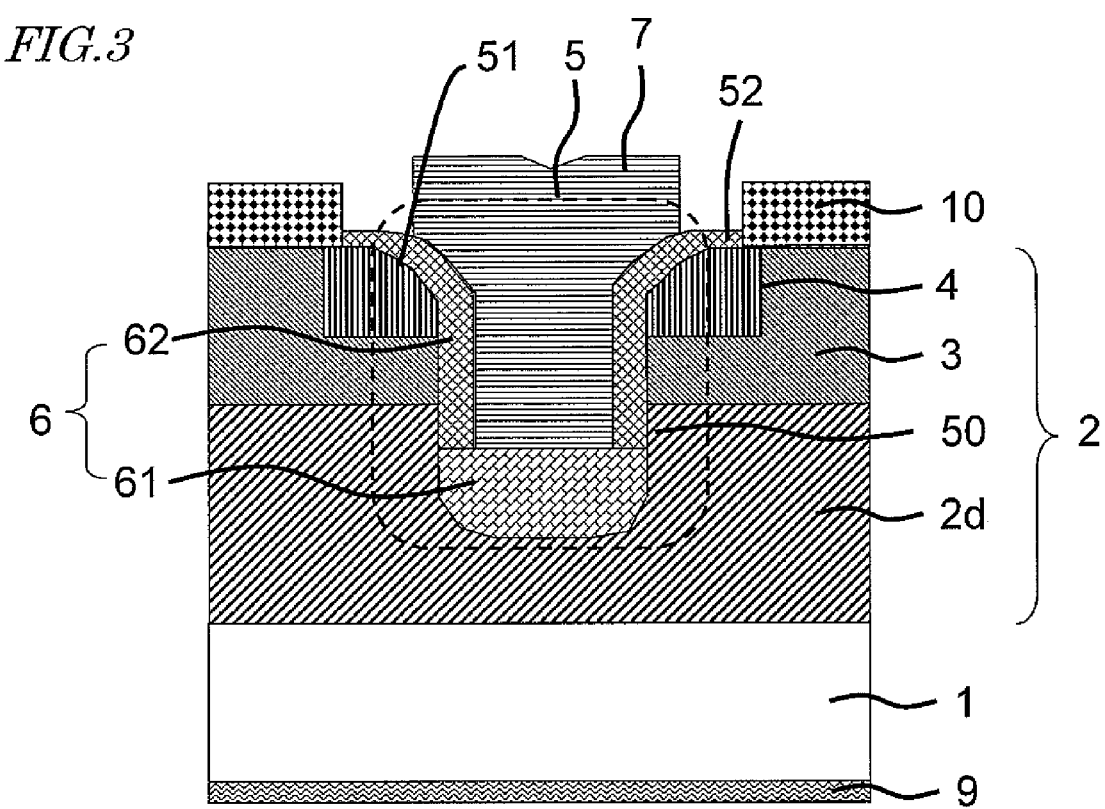
FIG. 3 A cross-sectional view illustrating the shape of a silicon carbide semiconductor element as a modified example of the first embodiment.

Depending on the degree of rounding at the bottom of the trench 5, a significant part of the bottom of the trench 5 could be a plane that is close to an Si plane. In that case, the gate insulating film 6 to be formed on the bottom of the trench 5 by thermal oxidation could be as thin as on the Si plane 52. To avoid such a situation, the gate insulating film 6 may be made up of an insulating film 6 that has been embedded in the trench 5 and a thermal oxide film 62 that has been formed on the sidewall of the trench 5 as in the modified example shown in FIG. 3. Such a gate insulating film 6 can be obtained by forming an embedded insulating film 61 at the bottom of the trench 5 in advance and then forming a thermal oxide film 62 on the sidewall 50 of the trench 5. The insulating film 61 may be formed by embedding a plasma oxide film in the trench 5 and then leaving the plasma oxide film at the bottom by wet etching. Alternatively, the gate insulating film at the bottom of the trench 5 may be thickened by decreasing the degree of crystallinity with ions implanted into the bottom of the trench 5 and then by increasing the oxidation rate during the thermal oxidation process.

Figure 4:
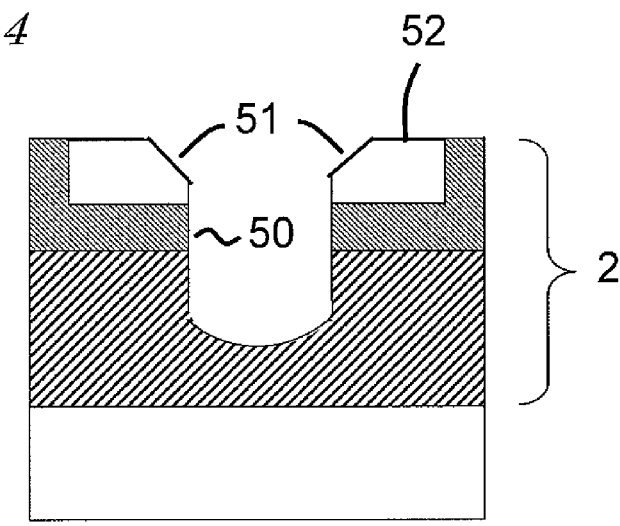
FIG. 4 A cross-sectional view illustrating a trench with another shape for the silicon carbide semiconductor element of the first embodiment.

In the embodiment described above, the upper corner region 51 is formed as a rounded region. Alternatively, the upper corner region 51 may also be a flat region which is obtained by chamfering the edge of the rim at the corner portion 5A as shown in FIG. 4.

Figure 5:
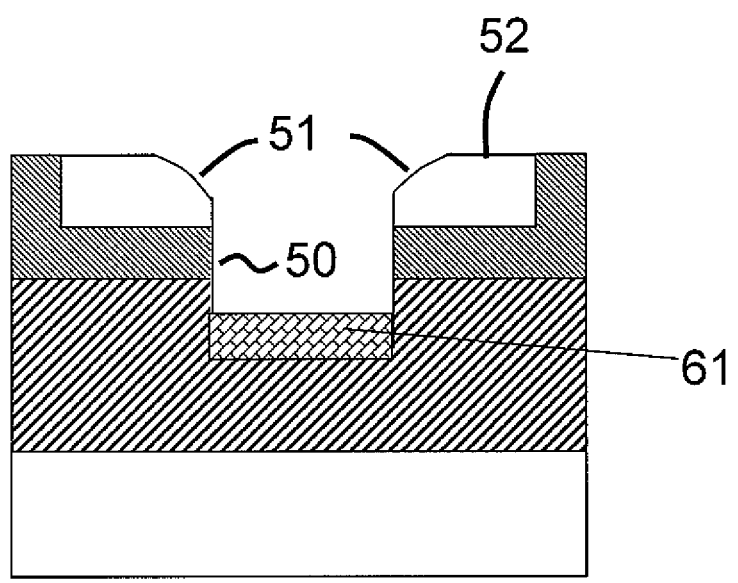
FIG. 5 A cross-sectional view illustrating a trench with still another shape for the silicon carbide semiconductor element of the first embodiment.

Furthermore, even though the upper corner region 51 is formed by annealing process according to the method that has been described with reference to FIG. 2, anisotropic etching may also be used. In that case, the corner at the rim of the trench 5 is rounded as shown in FIG. 5 but a significant part of the bottom of the trench 5 could be a (0001) facet surface (Si just plane). In such a situation, an embedded insulating film 61 may be formed at the bottom of the trench 5 before a thermal oxide film is formed. Optionally, any method (such as CMP or sacrificial oxidation) other than annealing process or anisotropic etching may also be used.

Embodiment 2

Figure 6:
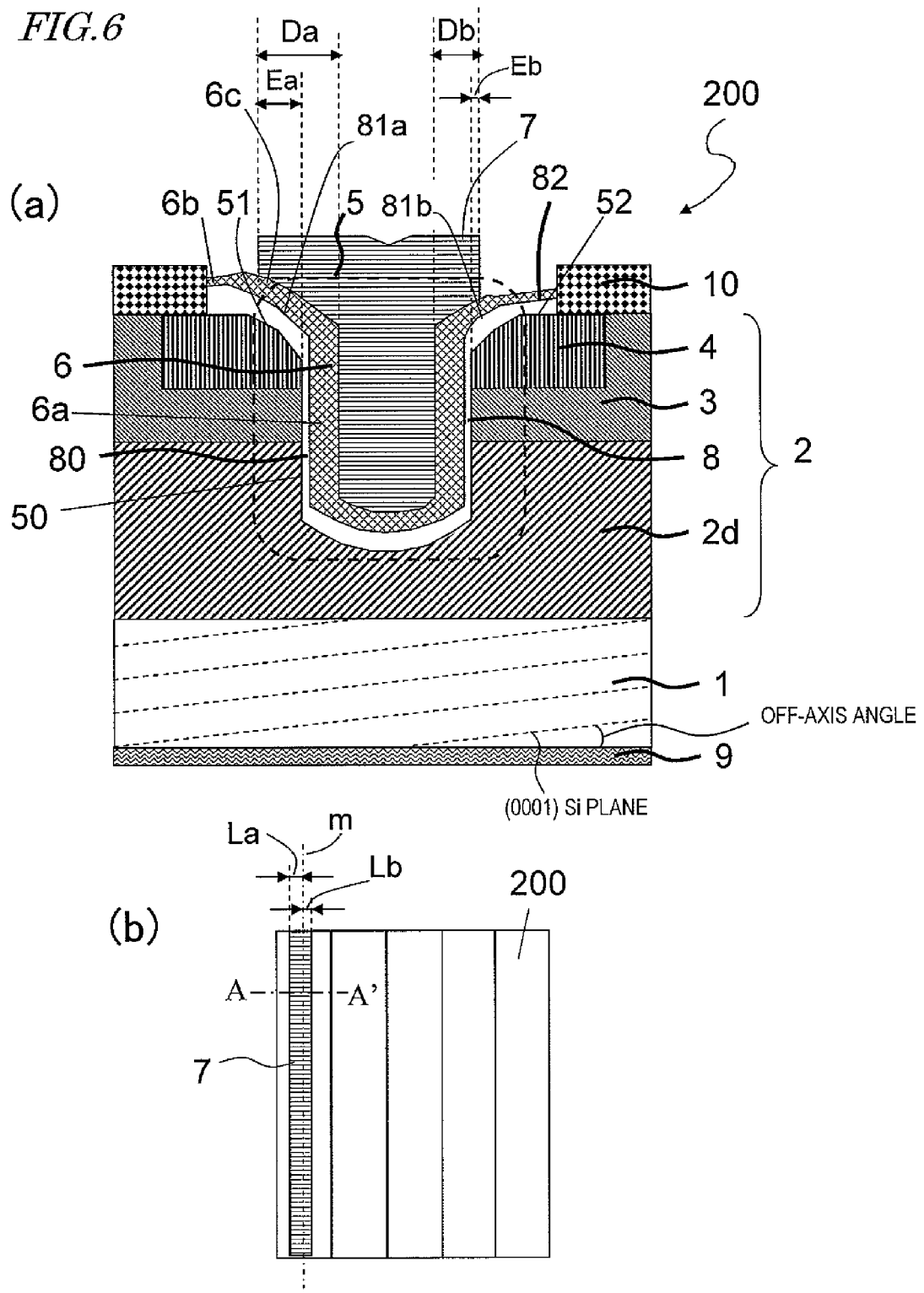
FIG. 6 Illustrates conceptually a silicon carbide semiconductor element as a second exemplary embodiment, wherein (a) is a cross-sectional view and (b) is a plan view illustrating an exemplary arrangement in which rectangular unit cells run.

Hereinafter, a second embodiment of a silicon carbide semiconductor element according to the present invention will be described with reference to FIG. 6. FIG. 6(a) is a cross-sectional view illustrating a unit cell 200 of the silicon carbide semiconductor element of this embodiment and FIG. 6(b) is a plan view illustrating a situation where rectangular unit cells run in stripes. The unit cell 200 may also have any other shape such as a square or polygonal shape. In FIG. 6, any component also shown in FIG. 1 and having substantially the same function as its counterpart is identified by the same reference numeral and description thereof will be omitted herein for the sake of simplicity.

Each unit cell 200 of this embodiment includes a silicon carbide epitaxial layer 8 between the trench 5 and the gate insulating film 6, which is a difference from the unit cell 100 of the first embodiment shown in FIG. 1. The silicon carbide epitaxial layer 8 functions as a channel layer. In this embodiment, an SiC substrate with an off-axis angle is also used as the silicon carbide substrate 1, and the silicon carbide semiconductor element is fabricated on a (0001) Si plane of the silicon carbide substrate 1. FIG. 6(a) illustrates a cross-sectional structure as viewed perpendicularly to the principal surface of the silicon carbide substrate 1 and to the sidewall 50 (e.g., a cross-sectional structure as viewed parallel to the off-axis direction). On this cross section, the principal surface of the silicon carbide substrate 1 is tilted with respect to a (0001) Si plane. As can be seen from FIG. 6(b), in this example, the trenches 5 run in the same direction as the striped unit cells 200 when viewed along a normal to the principal surface of the silicon carbide substrate 1. And the cross-sectional view shown in FIG. 6(a) illustrates a cross-sectional structure as viewed perpendicularly to the direction in which the trenches 5 run (i.e., the longitudinal direction). If the unit cells have a rectangular or polygonal shape, the cross-sectional view shown in FIG. 6(a) illustrates a cross-sectional structure as viewed perpendicularly to the two opposed sidewalls 50 of the trench 5.

The silicon carbide epitaxial layer 8 is arranged to cover at least a part of the sidewall 50 of the trench 5 (at least on the sidewall of the body region 3), the upper corner region 51 of the trench 5 and the upper surface (Si plane) 52 of the silicon carbide layer 2. The surface of the silicon carbide epitaxial layer 8 includes the surface 80 of its portion on the sidewall 50 (which will be referred to herein as the "sidewall 80"), the surface 82 of its portion on the Si plane 52 (which will be referred to herein as the "upper surface 82") and epi-layer's upper corner regions 81a and 81b between those surfaces. The upper surface 82 of the silicon carbide epitaxial layer 8 is an Si plane. The epi-layer's upper corner regions 81a and 81b are arranged on a pair of upper corner regions 51 of the trench 5. In the example illustrated in FIG. 6, the epi-layer's upper corner regions 81a and 81b are rounded regions with a round shape.

On a cross section which intersects at right angles with the principal surface of the silicon carbide substrate 1 and to the sidewall 50, the principal surface of the silicon carbide substrate 1 is tilted with respect to a (0001) Si plane and the pair of epi-layer's upper corner regions 81a and 81b that face each other are horizontally asymmetric to each other. For example, these regions 81a and 81b may have mutually different radii of curvature. The first epi-layer's upper corner region 81a that is located upstream of the off-axis in the two epi-layer's upper corner regions (e.g., on the left-hand side of the trench in FIG. 6) is broader than the second epi-layer's upper corner region 81b that is located downstream of the off-axis (e.g., on the right-hand side of the trench in FIG. 6).

Figure 11:
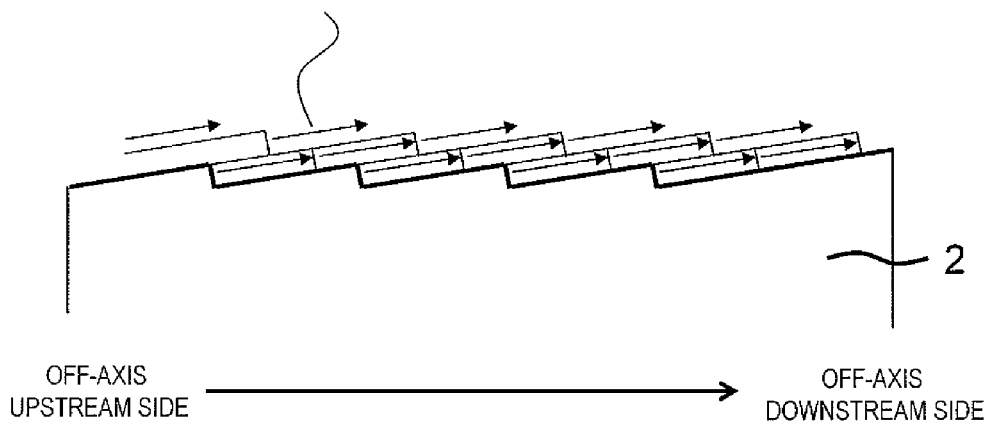
FIG. 11 An enlarged cross-sectional view illustrating the step flow growing direction and the off-axis upstream and downstream sides in an epitaxial growth process.

Now it will be described what "upstream of the off-axis" and "downstream of the off-axis" mean in this description. An off-axis angle is formed between a (0001) plane as indicated by the dotted line in this cross-sectional view and the surface of the substrate. And due to this off-axis angle, the epitaxial growth advances in a step flow mode from the left-hand side (i.e., upstream) to the right-hand side (i.e., downstream) on the paper. Thus, when a cross section is viewed so that the (0001) plane rises upper-rightward due to that off-axis angle, the left-hand side is defined herein to be "upstream" and the right-hand side is defined herein to be "downstream". FIG. 11 is an enlarged cross-sectional view showing the step flow growing direction, upstream of the off-axis, and downstream of the off-axis when the silicon carbide layer 2 is formed. In the following description, the downstream side of the off-axis that is the right-hand side of the cross-sectional view shown in FIG. 11 will also be referred to herein as a "direction toward which a (0001) Si plane rises upward with respect to the principal surface of the silicon carbide substrate".

On the sidewall 80, bottom, and epi-layer's upper corner regions 81a and 81b of the silicon carbide epitaxial layer 8 that has been formed to cover the trench 5, stacked is a gate insulating film 6, which may be either a silicon dioxide film formed by thermal oxidation or a silicon dioxide film including nitrogen (N). The portion 6a of the gate insulating film 6 on the sidewall 50 of the trench 5 (at least on the sidewall of the body region 3) and the portion 6c on the epi-layer's upper corner regions 81a and 81b contact with the gate electrode 7.

The silicon carbide semiconductor element of this embodiment can achieve the same effects as the first embodiment described above. In addition, according to this embodiment, high mobility is realized by forming the silicon carbide epitaxial layer 8. On top of that, by appropriately adjusting the carrier concentration and thickness of the silicon carbide epitaxial layer 8, the threshold voltage of the MISFET can be controlled, too.

In this embodiment, in the cross-sectional view shown in FIG. 6, the two end portions of the gate electrode 7 are located over the epi-layer's upper corner regions 81a and 81b, respectively. On the other hand, the portion 6b of the gate insulating film 6 that is located on the Si plane 82 of the silicon carbide epitaxial layer 8 does not contact with the gate electrode 7.

Alternatively, the gate electrode 7 may also be arranged so as to shift toward the off-axis upstream side with respect to the trench 5. In other words, when viewed along a normal to the principal surface of the silicon carbide substrate 1, the width Da of a portion of the first epi-layer's upper corner region 81a that is overlapped by the gate electrode 7 is greater than the width Db of a portion of the second epi-layer's upper corner region 81b that is overlapped by the gate electrode 7. As a result, the gate breakdown voltage can be increased with the gate electrode 7 kept sufficiently wide. Stated otherwise, in the cross-sectional view shown in FIG. 6, the distance Ea from the off-axis upstream side end portion of the gate electrode 7 to the off-axis upstream side sidewall of the trench 5 is longer than the distance Eb from the off-axis downstream side end portion of the gate electrode 7 to the off-axis downstream side sidewall of the trench 5.

In this example, when viewed along a normal to the principal surface of the silicon carbide substrate 1, the gate electrode 7 has an asymmetric shape with respect to the centerline m that is defined in the longitudinal direction of the trench 5 as shown in FIG. 6(b). That is to say, the distance La from the centerline m of the trench 5 to the off-axis upstream side end portion of the gate electrode 7 becomes longer than the distance Lb from the centerline m that runs in the longitudinal direction of the trench 5 to the off-axis downstream side end portion of the gate electrode 7.

Figure 7:
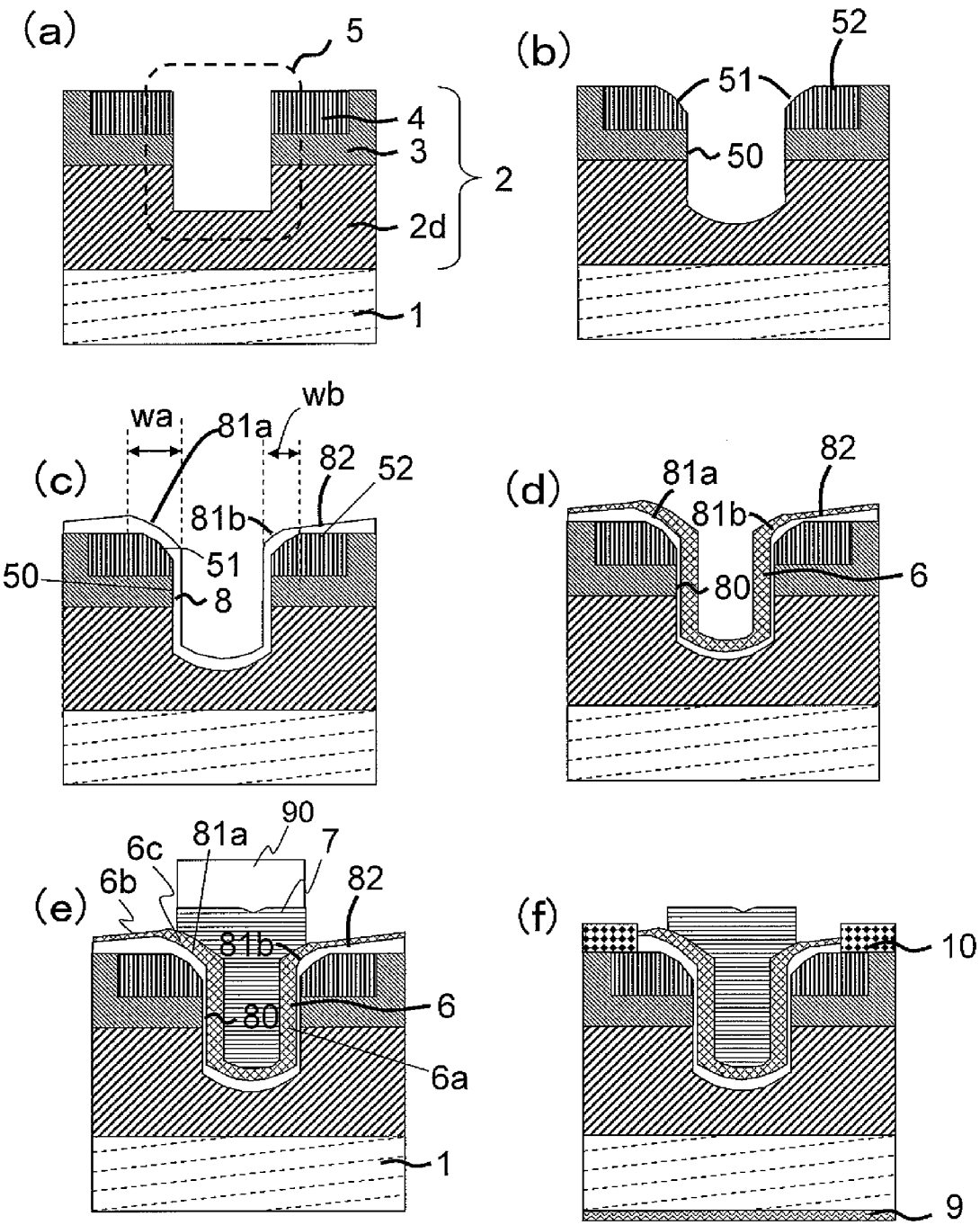
FIG. 7(a) through (f) are cross-sectional views illustrating respective manufacturing process steps that need to be performed to fabricate a silicon carbide semiconductor element according to a second exemplary embodiment.

Next, a method for fabricating a silicon carbide semiconductor element according to this second embodiment will be described in detail. FIG. 7 is a cross-sectional view illustrating a series of manufacturing process steps that need to be performed to make the silicon carbide semiconductor element of this second embodiment.

First of all, as shown in FIG. 7(a), a trench 5 is formed in the silicon carbide layer 2 that has been formed on the principal surface of the silicon carbide substrate 1. The respective structures of the silicon carbide substrate 1, the silicon carbide layer 2 and the trench 5 and the respective methods of forming the silicon carbide layer 2 and cutting the trench 5 are the same as what has already been described with reference to FIG. 2(a).

Next, as shown in FIG. 7(b), an upper corner region 51 is formed at the corner portion at the rim of the trench 5 by performing an annealing process as already described with reference to FIG. 2(b).

Subsequently, as shown in FIG. 7(c), a silicon carbide epitaxial layer 8 is formed as a channel layer on the inner wall surface of the trench 5. Specifically, an n-type silicon carbide epitaxial layer 8 with a carrier concentration of $1 \times 10^{18}$ cm$^{-3}$, for example, is formed on the surface of the silicon carbide layer 2, through which the trench 5 has been cut. The silicon carbide epitaxial layer 8 may have a thickness of 70 nm, for example, on the sidewall 50 of the trench 5. A portion of the silicon carbide epitaxial layer 8 located on the upper surface 52 of the silicon carbide layer 2 comes to have an Si plane as its surface.

In the example illustrated in FIG. 7, the silicon carbide epitaxial layer 8 on the upper corner region (rounded region) 51 comes to have a horizontally asymmetric shape due to the off-axis angle. In this case, the radius of curvature (e.g., 0.6 μm) of the epi-layer's upper corner region 81a on the off-axis upstream side becomes larger than the radius of curvature (e.g., 0.3 μm) of the epi-layer's upper corner region 81b on the off-axis downstream side. Also, the width wa (of 0.2 μm to 1.0 μm, for example) of the epi-layer's upper corner region 81a becomes greater than the width wb (of 0.1 μm to 0.5 μm of the trench 5) of the epi-layer's upper corner region 81b.

It should be noted that the annealing process step to form the rounded region shown in FIG. 7(b) and the SiC epitaxial growth process step on the inner wall surface of the trench shown in FIG. 7(c) can be carried out continuously in the same system.

Next, as shown in FIG. 7(d), a gate insulating film 6 is formed on the silicon carbide epitaxial layer 8 just as already described with reference to FIG. 2(c). As a result, a silicon dioxide film (thermal oxide film) is formed as the gate insulating film 6 on the sidewall 80, the bottom and the epi-layer's upper corner regions 81a and 81b of the silicon carbide epitaxial layer 8 that covers the trench 5. The silicon dioxide film may have a thickness of 70 nm on the sidewall 80 and a thickness of 60 nm on the epi-layer's upper corner regions 81a and 81b. Meanwhile, a silicon dioxide film with a thickness of 20 nm is formed on the planar surface (Si plane) 82 of the silicon carbide epitaxial layer 8.

Subsequently, as shown in FIG. 7(e), a gate electrode 7 is formed so as to contact with the portion 6c of the gate insulating film 6 on the epi-layer's upper corner regions 81a and 81b and with the portion 6a of the gate insulating film 6 on the sidewall 80. In this example, the gate electrode 7 does not contact with the portion 6b on the planar surface (Si plane) 82. Also, the end portions of the gate electrode 7 are located on the epi-layer's upper corner regions 81a and 81b. As a result, it is possible to prevent even more effectively the intensity of the electric field from being excessively high on the portion 6b on the Si plane.

Furthermore, in this embodiment, the gate electrode 7 is arranged so as to shift (by approximately 0.1 μm or more) toward the off-axis upstream side because the epi-layer's upper corner regions 81a and 81b have been deformed and are horizontally asymmetric to each other. As a result, the gate breakdown voltage can be increased with the gate electrode 7 kept wide enough.

Such a gate electrode 7 may be formed in the following manner, for example. First of all, a conductive film such as polysilicon (not shown) is deposited over the gate insulating film 6. Thereafter, the conductive film is selectively masked with a mask layer 90 of photoresist, for example. In this process step, the photomask may be designed so that when viewed along a normal to the principal surface of the silicon carbide substrate 1, the mask layer 90 becomes asymmetric with respect to the centerline of the trench 5 (i.e., the centerline of the trench 5 in the longitudinal direction in this example). For example, the photomask may be designed so that the distance Ea from the sidewall 50 of the trench 5 on the off-axis upstream side to the end portion of the mask layer 90 on the off-axis upstream side becomes longer than the distance Eb from the sidewall 50 of the trench 5 on the off-axis downstream side to the end portion of the mask layer 90 on the off-axis downstream side. Alternatively, by using the same photomask as in a situation where the gate electrode 7 is not shifted and by offsetting the photomask toward the off-axis upstream side by a predetermined distance, a mask layer 90 which is asymmetric with respect to the centerline of the trench 5 may also be obtained. Thereafter, by etching the conductive film using the mask layer 90 as an etching mask, a gate electrode 7 that has been shifted toward the off-axis upstream side can be obtained. It should be noted that the conductive film to be the gate electrode 7 may be deposited and etched just as already described with reference to FIG. 2(d).

The distance from the centerline of the trench 5 to that of the gate electrode 7 (which will be referred to herein as the "magnitude of shift") when viewed along a normal to the principal surface of the silicon carbide substrate 1 is calculated by either (La−Lb)/2 or (Ea−Eb)/2. The magnitude of shift may be set to be greater than the magnitude of ordinary misalignment (of less than 0.1 μm, for example). The magnitude of shift may be appropriately determined by the widths of the epi-layer's upper corner regions 81a and 81b, for example.

Subsequently, as shown in FIG. 7(f), a source electrode 10 and a drain electrode 9 are formed just as already described with reference to FIG. 2(e).

As described above, the gate insulating film 6 on the upper surface (Si plane) 82 of the silicon carbide epitaxial layer 8 becomes approximately 0.25 to 0.3 times as thick as itself on the sidewall 80 of the trench 5. However, the gate insulating film 6 at the epi-layer's upper corner regions 81a and 81b becomes approximately 0.5 to 1.0 time as thick as itself on the sidewall 80 of the trench 5. Consequently, a thicker oxide film can be formed on the epi-layer's upper corner regions 81a and 81b than on the Si plane.

In addition, the gate electrode 7 is formed so as to contact with the gate insulating film 6 on the epi-layer's upper corner regions 81a and 81b and on the trench's sidewall 80 but not to contact with the gate insulating film 6 on the upper surface (Si plane) 82. As a result, a sufficiently high gate breakdown voltage can be secured even more effectively. More specifically, if the MISFET is operated with a gate voltage of 20 V, the intensity of an electric field applied to the gate insulating film 6 will be as low as 3.3 MV/cm (=20 V÷60 nm). Thus, it is possible to prevent the gate insulating film 6 from getting broken down.

On top of that, according to this embodiment, the width of the gate electrode 7 can be increased (e.g., greater than the width D of the trench 5) on a cross section which intersects at right angles with the principal surface of the silicon carbide substrate 1. Consequently, the gate resistance can be reduced so much as to maintain sufficiently high switching performance as well.

In addition, by performing an annealing process to form the upper corner region 51, RIE damage done on the inside of the trench 5 has been removed. As a result, the gate insulating film 6 can have a high degree of reliability.

Hereinafter, the differences between the first and second embodiments will be described in further detail with reference to the accompanying drawings.

Figure 9:
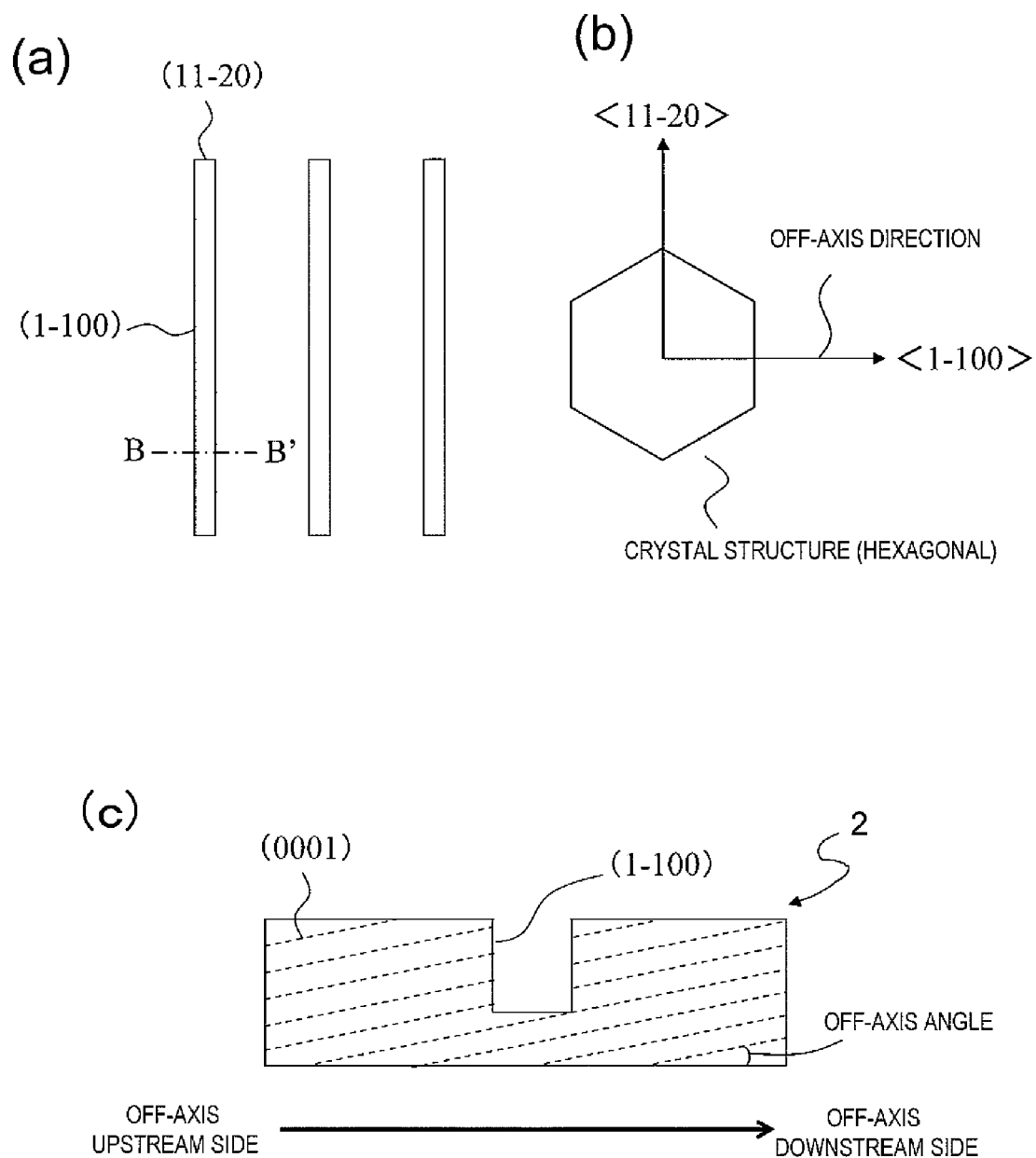
FIG. 9(a) through (c) are schematic representations showing another relation between the off-axis direction of the silicon carbide substrate of the second embodiment and the plane orientation of a channel surface of a trench, which (a) is a plan view, (b) is an enlarged plan view, and (c) is a an enlarged cross-sectional view of the silicon carbide layer.

FIGS. 8 and 9 are schematic representations showing the off-axis direction of the silicon carbide substrate 1 of the second embodiment and the plane orientation of the channel surface of the trench. FIGS. 8(a) and 9(a) are plan views of the trenches 5 as viewed from over the surface of the wafer. FIGS. 8(b) and 9(b) show the relation between the direction in which the trenches 5 run and the off-axis direction in FIGS. 8(a) and 9(a). And FIGS. 8(c) and 9(c) are cross-sectional views of the channel surface of the trench 5 as viewed on the plane B-B'. As indicated by the dotted lines in these cross-sectional views, there is an off-axis angle between the (0001) plane and the surface of the substrate. Also, in these drawings, the left-hand side is defined to be the off-axis upstream side and the right-hand side is defined to be the off-axis downstream side.

As described above, according to the second embodiment, if the off-axis direction of the silicon carbide substrate 1 is the <11-20> direction, the plane orientation of the channel surface of the trench 5 is defined to be {11-20} as shown in FIG. 8. On the other hand, if the off-axis direction of the silicon carbide substrate 1 is the <1-100> direction, the plane orientation of the channel surface of the trench 5 is defined to be {1-100} as shown in FIG. 9.

If the silicon carbide epitaxial layer 8 is formed as a channel layer on the inner wall surface of the trench 5, then an SiC epitaxial layer will grow horizontally asymmetrically. This is because (0001) facet planes (Si just planes), which are stabilized crystal planes, are produced on the planar surface and form planes that are parallel to the off-axis angle of the silicon carbide substrate 1. As a result, as shown in FIG. 7(c), there arises the phenomenon that the silicon carbide epitaxial layer 8 formed on the Si plane on the left-hand side of the trench 5 becomes thicker than the silicon carbide epitaxial layer 8 formed on the Si plane on the right-hand side of the trench 5. Consequently, at the corner portion 5A at the rim of the trench 5, the silicon carbide epitaxial layer 8 becomes horizontally asymmetric to each other and horizontally asymmetric epi-layer's upper corner regions 81a and 81b are formed. The radius of curvature of the epi-layer's upper corner region 81a on the off-axis upstream side becomes two to four times as large as that of the epi-layer's upper corner region 81b on the off-axis downstream side, for example.

Furthermore, since an n-type silicon carbide epitaxial layer 8 has been grown epitaxially as a channel layer on the inner wall surface of the trench 5, high channel mobility is realized. In addition, by changing the carrier concentration and thickness of the silicon carbide epitaxial layer 8, the threshold voltage of the MISFET can be adjusted.

Optionally, the gate electrode 7 may be shifted to the off-axis upstream side so as to follow the horizontally asymmetric epi-layer's upper corner regions. As a result, the precision of overlap can have a greater margin in a photolithographic process and it is possible to prevent the gate electrode 7 from contacting with the insulating film on the planar surface 82. Consequently, the yield of the MISFET can be increased.

INDUSTRIAL APPLICABILITY

A silicon carbide semiconductor element according to an aspect of the present invention can be used suitably in a semiconductor device such as a transistor, and can be used particularly effectively as a power semiconductor device for use in an EV, an HEV and other cars or an inverter for industrial equipment.

REFERENCE SIGNS LIST 100, 200 silicon carbide semiconductor element's unit cell
1 silicon carbide substrate
2 silicon carbide layer
2d drift region
3 body region
4 source region
5 trench
6 gate insulating film
7 gate electrode
8 silicon carbide epitaxial layer
9 drain electrode
10 source electrode
50, 80 trench's sidewall
51 upper corner region
52, 82 planar surface (Si plane)
81a, 81b epi-layer's upper corner region

The invention claimed is:

1. A silicon carbide semiconductor element comprising:
   a silicon carbide substrate which has a principal surface tilted with respect to a (0001) Si plane;
   a silicon carbide layer which is arranged on the principal surface of the silicon carbide substrate;
   a trench which is arranged in the silicon carbide layer and which has a bottom, a sidewall, and an upper corner region that is located between the sidewall and an upper surface of the silicon carbide layer;
   a gate insulating film which is arranged on at least a part of the sidewall and on at least a part of the upper corner region of the trench and on at least a part of the upper surface of the silicon carbide layer; and
   a gate electrode which is arranged on a part of the gate insulating film, wherein:
   the upper corner region has a surface which is different from the upper surface of the silicon carbide layer and from a surface that defines the sidewall,
   the gate electrode contacts with both of a first portion of the gate insulating film located on the upper corner region and a second portion of the gate insulating film located on the sidewall,
   the first portion of the gate insulating film is thicker than a third portion of the gate insulating film which is located on the upper surface of the silicon carbide layer,
   an end portion of the gate electrode is located on the upper corner region, and
   on a cross section which intersects at right angles with the principal surface of the silicon carbide substrate and with the sidewall of the trench, the gate electrode is wider than the width of the trench in a direction extending along the principal surface of the silicon carbide substrate and is not arranged on the third portion of the gate insulating film.

2. The silicon carbide semiconductor element of claim 1, further comprising a silicon carbide epitaxial layer which is arranged between the trench and the gate insulating film,
   wherein the silicon carbide epitaxial layer has an epi-layer's upper corner region which is located on the upper corner region, and
   wherein the end portion of the gate electrode is located on the epi-layer's upper corner region.

3. The silicon carbide semiconductor element of claim 2, wherein on the cross section which intersects at right angles with the principal surface of the silicon carbide substrate and with the sidewall of the trench, the principal surface is tilted with respect to the (0001) Si plane, the epi-layer's upper corner region includes a first epi-layer's upper corner region and a second epi-layer's upper corner region which faces the first epi-layer's upper corner region and which is located in a direction, toward which the (0001) Si plane tilted rises with respect to the principal surface of the silicon carbide substrate, compared to the first epi-layer's upper corner region, and the width of the first epi-layer's upper corner region in the direction extending along the principal surface of the silicon carbide substrate is greater than that of the second epi-layer's upper corner region.

4. The silicon carbide semiconductor element of claim 3, wherein when viewed along a normal to the principal surface of the silicon carbide substrate, the width of a portion of the first epi-layer's upper corner region in the direction extending along the principal surface of the silicon carbide substrate, which is overlapped by the gate electrode is greater than that of a portion of the second epi-layer's upper corner region which is overlapped by the gate electrode.

5. The silicon carbide semiconductor element of claim 1, wherein on a cross section which intersects at right angles with the principal surface of the silicon carbide substrate, the upper corner region has a width of 0.1 µm to 1 µm in the direction extending along the principal surface of the silicon carbide substrate.

6. The silicon carbide semiconductor element of claim 1, wherein the principal surface of the silicon carbide substrate is tilted in a <11-20> direction with respect to the (0001) Si plane and the plane orientation of the trench's sidewall is {11-20}.

7. The silicon carbide semiconductor element of claim 1, wherein the principal surface of the silicon carbide substrate is tilted in a <1-100> direction with respect to the (0001) Si plane and the plane orientation of the trench's sidewall is {1-100}.

8. The silicon carbide semiconductor element of claim 1, wherein the principal surface of the silicon carbide substrate defines a tilt angle of 0.1 to 10 degrees with respect to the (0001) Si plane.

9. The silicon carbide semiconductor element of claim 1, wherein the gate insulating film includes a thermal oxide film.

10. A method for fabricating a silicon carbide semiconductor element, the method comprising the steps of:
    providing a silicon carbide substrate which has a principal surface tilted with respect to a (0001) Si plane, a silicon carbide layer being arranged on the principal surface;
    forming a trench in the silicon carbide layer, the trench having a bottom, a sidewall, and an upper corner region that is located between the sidewall and an upper surface of the silicon carbide layer, the upper corner region having a surface which is different from the upper surface of the silicon carbide layer and from a surface that defines the sidewall;
    forming a gate insulating film on at least a part of the sidewall and on at least a part of the upper corner region of the trench and on at least a part of the upper surface of the silicon carbide layer, a first portion of the gate insulating film which is located on the upper corner region being thicker than a third portion of the gate insulating film which is located on the upper surface of the silicon carbide layer; and
    forming a gate electrode on a part of the gate insulating film so that the gate electrode contacts with both the first portion of the gate insulating film and a second portion of the gate insulating film which is located on the sidewall, that an end portion of the gate electrode is located on the upper corner region, and that on a cross section which intersects at right angles with the principal surface of the silicon carbide substrate and with the sidewall of the trench, the gate electrode is wider than the width of the trench in a direction extending along the principal surface of the silicon carbide substrate and is not arranged on the third portion of the gate insulating film.

11. The method for fabricating a silicon carbide semiconductor element of claim 10, further comprising, after the step of forming a trench in the silicon carbide layer and before the step of forming a gate insulating film, the step of forming a silicon carbide epitaxial layer on at least a part of the sidewall and on at least a part of the upper corner region of the trench.

12. The method for fabricating a silicon carbide semiconductor element of claim 11, wherein the silicon carbide epitaxial layer has an epi-layer's upper corner region which is located on the upper corner region, and
    wherein the end portion of the gate electrode is located on the epi-layer's upper corner region, and wherein on the cross section which intersects at right angles with the principal surface of the silicon carbide substrate and with the sidewall of the trench, the principal surface is tilted with respect to the (0001) Si plane, the epi-layer's upper corner region includes a first epi-layer's upper corner region and a second epi-layer's upper corner region which faces the first epi-layer's upper corner region and which is located in a direction, toward which the (0001) Si plane tilted rises with respect to the principal surface of the silicon carbide substrate, compared to the first epi-layer's upper corner region in the direction extending along the principal surface of the silicon carbide substrate, and the width of the first epi-layer's upper corner region is greater than that of the second epi-layer's upper corner region, and wherein the gate electrode is formed so that when viewed along a normal to the principal surface of the silicon carbide substrate, the width of a portion of the first epi-layer's upper corner region, in the direction extending along the principal surface of the silicon carbide substrate, which is overlapped by the gate electrode is greater than that of a portion of the second epi-layer's upper corner region which is overlapped by the gate electrode.

13. The method for fabricating a silicon carbide semiconductor element of claim 10, wherein the step of forming a trench in the silicon carbide layer includes the steps of:

forming a recess in the silicon carbide layer; and subjecting the silicon carbide layer, in which the recess has been formed, to a heat treatment and forming the upper corner region at the corner of the recess' rim, thereby making the trench.

* * * * *